United States Patent
Wand et al.

(10) Patent No.: US 6,198,281 B1
(45) Date of Patent: Mar. 6, 2001

(54) NMR SPECTROSCOPY OF LARGE PROTEINS

(75) Inventors: A. Joshua Wand, Wallingford, PA (US); Mark R. Ehrhardt, Eugene, OR (US); Peter F. Flynn, Wallingford, PA (US)

(73) Assignee: The Research Foundation of State University of New York, Amherst, NY (US)

( * ) Notice: Subject to any disclaimer, the term of this patent is extended or adjusted under 35 U.S.C. 154(b) by 0 days.

(21) Appl. No.: 09/306,906

(22) Filed: May 7, 1999

Related U.S. Application Data (63) Continuation-in-part of application No. 08/967,996, filed on Nov. 12, 1997
(60) Provisional application No. 60/084,702, filed on May 8, 1998.

(51) Int. Cl.[7] .................................................. G01V 3/00
(52) U.S. Cl. .......................................... 324/300; 324/321
(58) Field of Search ..................................... 324/300, 311, 324/312, 307, 309, 321

(56) References Cited

U.S. PATENT DOCUMENTS

| | | | |
|---|---|---|---|
| 5,045,793 | 9/1991 | Rathke | 324/318 |
| 5,122,745 | * 6/1992 | Smith et al. | 324/300 |
| 5,517,856 | 5/1996 | Hofmann et al. | 324/321 |
| 5,668,734 | * 9/1997 | Krishna et al. | 324/300 |
| 5,977,772 | * 11/1999 | Wand et al. | 324/321 |

OTHER PUBLICATIONS

Wagner, "Activation Volumes for the Rotational Motion of Interior Aromatic Rings in Globular Proteins Determined by High Resolution [1] H NMR at Variable Pressure," Febs Letters, vol. 112, No. 2, pp. 280–284.

Yamada, "Pressure–resisting glass cell for high pressure, high resolution NMR measurement", Rev. Sci. Instrum., vol. 45, No. 5, May 1974, pp. 640–642.

Vanni et al., "Two Approaches to High–Resolution High–Pressure Nuclear Magnetic Resonance," Journal of Magnetic Resonance 29, 1978, pp. 11–19.

Roe, "Sapphire NMR Tube for High–Resolution Studies at Elevated Pressure," Journal of Magnetic Resonance 63, 1985, pp. 388–391.

Jonas et al., "High–Pressure NMR Spectroscopy of Proteins and Membranes," Annu. Rev. Biophys. Biomol. Struct. 23, 1994, pp. 287–318.

Jouanne, "High Resolution NMR Under Increased Hydrostatic Pressure: Keto–Enol Equilibrium of Acetylacetone," Journal of Magnetic Resonance 7, vol. 1, 1972, pp. 1–4.

* cited by examiner

Primary Examiner—Louis Arana
(74) Attorney, Agent, or Firm—Hodgson, Russ, Andrews, Woods & Goodyear LLP (57) ABSTRACT

The present invention provides a method for reducing the correlation time for global tumbling for analysis of proteins and other macromolecules by NMR spectroscopy. The method comprises placing a macromolecule, hydrated and without significant structure perturbation, within a reverse micelle in a suitable fluid medium of low viscosity. A high pressure NMR cell for use with the method of the present invention is also disclosed.

12 Claims, 11 Drawing Sheets

NMR SPECTROSCOPY OF LARGE PROTEINS

This application claims the priority of a provisional application serial No. 60/084,702 filed on May 8, 1998, incorporated herein by reference, and is a continuation-in-part of U.S. patent application Ser. No. 08/967,996, filed on Nov. 12, 1997.

This work was supported by grant number GM35940 from the NIH. The government has certain rights in the invention.

FIELD OF THE INVENTION

This invention generally relates to the field of NMR spectroscopy. More specifically, this invention relates to a process and apparatus for a high-resolution NMR spectroscopic analysis of molecules, particularly, macromolecules.

BACKGROUND OF THE INVENTION

Nuclear magnetic resonance (NMR) spectroscopy continues to play a central role in the characterization of the structure and dynamics of proteins, nucleic acids, carbohydrates and their complexes. Over the past fifteen years there have been staggering developments in NMR techniques and supporting technologies such that the comprehensive structural characterization of 20 kDa proteins is becoming almost routine. Second only to crystallography, NMR spectroscopy provides an unparalleled view of structure and it remains second to none in its ability to examine dynamic phenomena. NMR also provides a unique avenue to monitor the full structural and dynamic effects of changes in temperature, solution conditions and the binding of small and large ligands.

Application of NMR to Analysis of Protein Structure

The size of proteins that can be analyzed by modern NMR techniques has dramatically increased over the past decade. Coupled with the introduction of heteronuclear (Sorensen et al., 1987, *Progr. NMR Spectroscopy* 16:163–192.) and ultimately triple resonance (Kay et al., 1990, J. Magn. Reson. 89:495–514.) spectroscopy, was the widespread use of recombinant technologies to introduce NMR-active isotopes into proteins and nucleic acids (LeMaster, 1994 *Progr. NMR Spectroscopy* 26:371–419; McIntosh & Dahlquist, 1990, *Q. Rev. Biophys.* 23:1–38). With the development of multinuclear and multidimensional capabilities, NMR is now able to confidently, efficiently and comprehensively deal with small proteins with significant spectral complexity. However, for large proteins, increasing size brings with it several important limitations which unfortunately compound each other. This severely limits the size of a protein that can be efficiently approached by modern NMR techniques.

One limitation is that increasing size leads to slower tumbling and correspondingly shorter spin-spin relaxation times. The basic engine of NMR spectroscopy of proteins, the triple resonance technology, begins to fail. As lines broaden, basic sensitivity also becomes a limiting issue. Another limitation is that increasing size leads to increasingly complex spectra: Spectral degeneracy complicates the assignment process and renders assignment of NOEs to parent hydrogens problematic.

One way to reduce the problems posed by the size and hence complexity of the protein is to reduce the limitations presented by short spin-spin relaxation times. As already mentioned, increasing size leads to shorter spin-spin relaxation times. Since the coherence transfer processes underlying current triple resonance-based assignment strategies are time-dependent, these approaches begin to fail with proteins ~30 kDa and larger. Random partial or perdeuteration has been used to successfully reduce the dipolar field such that high resolution $^{15}$N-HSQC spectra can be obtained (LeMaster, 1994, supra). Unfortunately, perdeuteration drastically limits the structural information available from the NOE. Fractional deuteration also has its own problems with respect to sensitivity and its limited applicability as a general solution to the dipolar broadening displayed by proteins above 35 kDa. Spectroscopic solutions are also appearing. Some find their roots in the steady improvement in the use of the rotating frame to provide for more efficient isotropic mixing for coherence transfer. One very recent advance is the selection of the narrow multiplet component arising due to the (fortuitous) cancellation of dipole—dipole coupling and chemical shift anisotropy in $^{15}$N—$^1$H correlation experiments (Pervushin et al., 1997, *Proc. Natl. Acad. Sci., USA*, 94:12366–12371). This particular approach will not relieve the limitations in other contexts. In short, though these and other current approaches are extremely helpful, they do not appear to be generally applicable nor generally robust.

Reverse Micelle Technology

Reverse micelles form spontaneously as transparent solutions in a low polarity liquid and are thermodynamically stable assemblies of surfactant molecules organized around a water core. Reverse micelles were the subject of extensive attention in the 1980s as potential devices for a range of applications including separations, chromatography and reaction processes (Goklen & Hatton, 1985, *Biotechnology Progress*, 1:69–74). More recently, they have become the focus of further attention in the context of hosting various chemical reactions in solvents with low environmental impact such as supercritical carbon dioxide (Johnston et al., 1996, *Science* 271:624–626).

The size and stability of reverse micelles is dependent upon the amount of water loading. Water loadings have been described that yield stable reverse micelles of AOT in a variety of long and short chain alkanes large enough to accommodate proteins (e.g., Frank & Zografi, 1969, *J. Colloid Interface Sci.* 29:27–35; Gale et al., 1987, *J. Am. Chem. Soc.* 109:920–921; Fulton & Smith, 1988, *J. Phys. Chem.* 92:2903–2907; Fulton et al., 1989, *J. Phys. Chem*, 93:4128-4204).

For the analysis of protein structure, while solid state NMR methods continue to show great progress and recent successes like the determination of the gramicidin channel illustrate the potential of these approaches (Ketchem et al., 1996, *J. of Bimolecular NMR* 8:1–14), solution NMR methods are easier to employ. However, the difficulty of dealing comprehensively with large proteins in a general manner remains as a significant limitation to applying solution NMR methods to the rapidly growing list of proteins being discovered by the molecular biology community.

Thus, there is an ongoing need for novel techniques and approaches for extending the technique of solution NMR to proteins, especially, larger proteins, and other macromolecules. For example, fully 25% of known open reading frame sequences appear to code for membrane proteins and over 50% code for proteins that are beyond the size accessible by current solution NMR methods.

SUMMARY OF THE INVENTION

The spin-spin relaxation time ($T_2$) is often the dominant limitation with respect to the successful application of modern multinuclear and multidimensional NMR spectroscopy to a particular protein. In the absence of unrestricted internal motions, $T_2$ increases as the correlation time for global tumbling tau(m) decreases. Increased $T_2$ results in a higher signal to noise ratio and the effectiveness of the currently available NMR techniques decreases.

The present invention provides a method for reducing the correlation time for global tumbling tau(m) for analysis of molecular structure by NMR. The method comprises placing a macromolecule, hydrated and without significant structure perturbation, within a reverse micelle rapidly tumbling in a suitable fluid medium. This is accomplished by encapsulating the protein of interest within the water cavity of a reverse micelle. The reverse micelle is in turn solvated by a low viscosity alkane solvent. Thus, although the micelle is larger than the encapsulated hydrated molecule, it tumbles faster in the alkane solvent than the molecule will in water. The use of a very low viscosity alkane solvent rests on the ability to prepare and maintain the sample under modest pressure (ranging up to 50 atm, depending on the solvent). Under these conditions, some alkane solvents have sufficiently low viscosities to provide for short correlation times for molecular tumbling of the entire reverse micelle. Also disclosed in the present invention is a unique pressure cell for pressurizing the sample using the high pressure cell technique for solution NMR spectroscopy.

Accordingly, an object of the present invention is to provide a method for high resolution NMR spectroscopy by reducing the effective tumbling time of molecules. This method is particularly useful for macromolecules.

Another object of the present invention is to provide a method for high resolution NMR spectroscopy of proteins by reducing the effective tumbling time.

Another object of the present invention is to provide a method for high resolution NMR spectroscopy of macromolecules at low temperature.

A further object of the present invention is to provide an apparatus for the analysis of molecules by NMR spectroscopy by using the method of the present invention.

DETAILED DESCRIPTION OF THE INVENTION

The present invention provides a novel method and apparatus for NMR spectroscopy of molecules. This method is particularly suitable for proteins and other macromolecules. The method utilizes reducing the effective tumbling time of molecules during NMR measurements by providing an environment of low viscosity for them. While examples are provided herein with particular reference to proteins, it will be apparent to those skilled in the art that the method of the present invention is suitable for other macromolecules also including, but not limited to, nucleic acids and carbohydrates.

A high pressure cell for conducting NMR measurements is also provided. The spin-spin relaxation time ($T_2$) is often the dominant limitation with respect to the successful application of modern multinuclear and multidimensional NMR spectroscopy to a particular protein. The spin-spin relaxation time decreases as the tumbling time of proteins during NMR measurement increases. The tumbling time of proteins is in turn, linearly related to the viscosity of the solvent.

In the present invention, solvents of low viscosity have been used to provide an environment of low viscosity for the protein. A "low viscosity fluid" or a "low-viscosity solvent" for the purposes of the specification and claims means any hydrophobic solvent with viscosity lower than about 300 $\mu$Pa.s. An example of low viscosity solvent is a short chain alkane whose intermolecular interactions are limited to London forces. Short chain alkanes suitable for the method of the present invention include, but are not limited to, straight or branched alkanes containing up to eight carbons. Thus, short chain alkanes include ethane, propane, butane, pentane, hexane, septane, octane and their corresponding branched alkanes. Ethane, propane and butane are gases at room temperature and pressure but are liquefied by modest pressures (Table 1). The viscosity of ethane, propane, butane and pentane is shown in Table 1. Other examples of low viscosity solvents include carbon dioxide, and halocarbons such as $CF_4$ and $CHF_3$ that are gases at room temperature and liquids at modest pressures used in NMR techniques.

TABLE 1

| Viscosity of Short Chain Alkane Fluids at 300 K | | | | | |
|---|---|---|---|---|---|
| | Ethane | Propane | Butane | Pentane | Water |
| Viscosity ($\mu$Pa · s) | 35 | 97 | 158 | ⁻220 | 850 |
| Pres5ure (MPa) | 4.7 | 1.05 | 0.40 | 0.10 | 0.10 |

Note: 1 MPa = 10 bar = 145 psi ⁻10 atm; 1 $\mu$Pa · s = $10^{-3}$ centipoise; The figure for pentane results from an interpolation.

While many liquids have low viscosity, the use of such liquids in NMR has heretofore not been possible since protein molecules could not be placed directly in these solvents under the pressures required for NMR.

Figure 1:
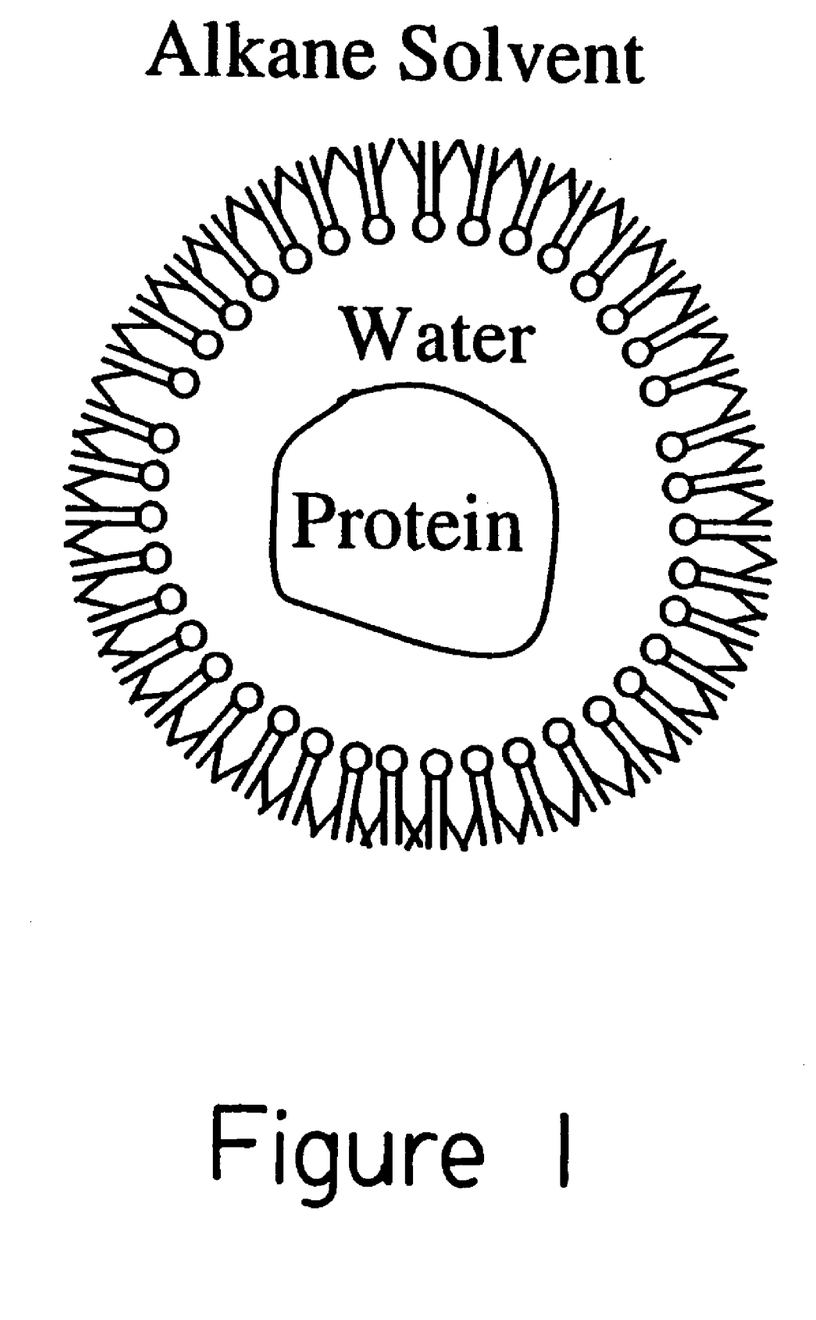
FIG. 1 is an illustration of a reverse micelle containing a water soluble protein.

To place the protein molecule in an environment of low viscosity solvents without affecting their structural integrity, the reverse micelle technology was used. To place a protein in a hydrophobic solvent such as alkane solvents, the protein molecules are encapsulated within the water cavity formed by so-called reverse micelles. The reverse micelles are formed by suitable surfactants. For forming reverse micelles, it is preferable to use surfactants that have branched or bulky tails and small head groups so that the head groups are directed towards the cavity of the micelle. Suitable surfactants include, but are not limited to, dioleylphosphoric acid (DOLPA) and sodium bis(2-ethylhexyl) sulfosuccinate (AOT). The size and stability of reverse micelles is dependent upon the amount of water loading. The commonly used surfactant, AOT has been extensively studied in this respect for a variety of organic solvents and is commonly used in the art to construct reverse micelle systems having a significant internal aqueous core. AOT reverse micelles have average aggregation numbers ranging between 45 and 70, depending on the amount of water loading in the interior. FIG. 1 is a schematic illustration of an AOT reverse micelle containing a water soluble protein. Such systems have been developed for a large number of proteins and are well known to those skilled in the art. Thus, many proteins exceeding 50 kDa in size have been successfully solublized by reverse micelles in organic solvents (Luisi et al., 1988, *Biochem Biophys Acta* 947:209–246; De et al., 1995, *Adv. Colloid Interface Sci.* 59:95–193; Goto et al., 1997, *Biotech. Bioeng.* 54:26–32; Johnston et al., 1996, *Science* 271:624–626).

While protein containing reverse micelles can be prepared by any method known to those skilled in the art, it is preferable to use a two-step passive phase transfer process whereby empty reverse micelles are prepared and then subsequently loaded with protein. The process by which hydrated proteins are encapsulated within reverse micelles in the low-viscosity solvent involves liquefaction of the solvent, salvation of the surfactant (AOT) in the solvent; and transfer or distribution of the hydrated protein into the AOT-solvent phase via encapsulation.

While variations of the basic approach will be apparent to those skilled in the art, two variations, by way of illustration, are presented herein. In both cases, the solvent is first liquefied within a pressure cell in the presence of AOT. Concurrent stirring (for example, by using a small conventional magnetic stir-bar) facilitates preparation of a homogenous solution of reverse micelles in the liquefied solvent. The solution of AOT reverse micelles is transferred into a second mixing cell which has been preloaded with the hydrated protein. The solution of AOT reverse micelles and the hydrated protein are then mixed until the desired loading of protein is achieved. The protein-solvent-AOT system is then transferred into the NMR cell. Alternatively, the solvent-AOT phase is delivered directly into the NMR cell, which has been preloaded with the hydrated protein. The hydrated protein is combined with the solvent-AOT phase using gentle agitation that may be aided by a free standing glass capillary filled with a lock solvent ($D_2O$).

Liquefaction of the solvent at a given temperature is achieved by raising the pressure of the system above the liquefaction pressure specified at the gas-liquid phase boundary by the pressure-temperature phase diagram for the solvent. Elevated pressure may be generated through standard means, for example, by using a pressure generator or the use of an inert gas. Transfer of solution of reverse micelles to a second mixing cell or to the NMR cell is readily accomplished by creating a small pressure difference (for example about 10 p.s.i.) between the vessels.

Solubilization of proteins in reverse micelles can be followed by optical methods. Fluorescent mutants can be used for proteins that have low absorbance and fluorescence. For example, a highly fluorescent mutant P45W has been reported for ubiquitin (Khorasanezadeh et al., 1993). A key component of the present invention is the degree to which proteins can be solubilized in a reverse micelle-containing organic phase. Though most examples of protein solubilization in reverse micelles have been undertaken at sub-100 $\mu$M concentrations of protein, there are many examples where sub-mM concentrations have been obtained. Indeed, it appears that low concentrations of solubilized proteins have been used by choice (for example, to avoid self—quenching of fluorophors) and does not reflect an inherent limitation. For example, the transfer of cytochrome c from neutral aqueous solutions of modest ionic strength to 250 mM AOT in isooctane has been shown to occur within minutes of mixing (Goklen & Hatton, 1985, supra). Final concentrations of cytochrome c approaching 0.25 mM in the organic micellar solution were easily obtained. Essentially complete transfer could be obtained. Thus, by varying the relative volumes of the aqueous and organic phases, the protein could be concentrated ($V_{aq}/V_{org}>1$) or diluted ($V_{aq}/V_{org}<1$) for use in the method of the present invention. Transfer efficiencies and indeed the direction of transfer are known to be dependent upon the ionic strength of the aqueous solution (Goklen & Hatton, 1985, supra). Thus, as is known to those skilled in the art, solubilization of proteins in reverse micelles can be selectively controlled by the choice of surfactant structure (e.g., cationic versus anionic), manipulation of pH and ionic strength and variation of surfactant concentration so that spectroscopic properties of the solvated proteins are essentially those of the water-solubilized protein.

The radius of a reverse micelle is determined by the width of the surfactant shell and the volume of the water pool and protein enclosed therein. For example, the radius of an empty AOT reverse micelle is about 15 A. The absolute surfactant concentration, and the relative water content should be chosen carefully as described by Gardner et al., (1997, Biochemistry, 36:1389–1401), which disclosure is herein incorporated by reference, so that the protein filled reverse micelle radius corresponds to the simple sum of the hydrated protein's effective radius and the chain length of the surfactant. In one embodiment, encapsulation of a spherical 50 kDa protein with a spherical hydrated radius of 26 Å will result in a minimal reverse micelle of about 41 Å. The corresponding molecular tumbling correlation time of the reverse micelle would be about 60 ns in water, about 11 ns in butane, about 7 ns in propane and about 2.5 ns in ethane. The resulting increase in $T_2$ according the method of the present invention makes proteins amenable to high resolution NMR. In another embodiment, encapsulation of a 100 kDa protein (spherical hydrated radius of 33 A) would have a corresponding reverse micelle radius of about 48 Å and would have a molecular tumbling correlation time of about 95 ns in water, about 18 ns in butane, about 11 ns in propane, and about 4 ns in ethane. These correlation time values are a significant improvement over the corresponding values in water directly which are 15 ns and 31 ns for the 50 kDa and the 100 kDa proteins respectively.

The use of low viscosity solvents like butane, propane or ethane as a liquid or supercritical fluid at or near room temperature requires the ability to pressurize the sample. In the context of NMR spectroscopy, this presents several challenges. A simple high pressure device that will allow state-of-the-art NMR spectroscopy to be safely carried out on proteins at intermediate pressures, up to 3,000 psi has been developed. These pressures will allow the prescribed reverse micelle approach to be used without great cost or difficulty and with the ability to employ the most powerful aspects of modem NMR spectroscopy of proteins. The design philosophies underlying the device employed are distinctly different than those required for extremely high pressure and allow the use of standard bore magnets and the state-of-the-art commercial instrument without significant risk or need for modification.

It must be emphasized that the pressures required for the method of the present invention are far below those required to detectably perturb the structure of a native-state protein as shown in Table 3.

TABLE 3

Typical Pressures for macromolecular transitions[a] and alkane liquefaction[b]

| | Pressure (kbar) |
|---|---|
| Enzyme inactivation | 0.10–0.50 |
| Ligand dissociation | 0.10–1.0 |
| Protein-protein dissociation | 1.0–2.0 |
| DNA helix dissociation | 2.0–3.0 |
| Protein-DNA dissociation | 2.0–3.0 |
| Protein denaturation (3° structure) | 4–5 |
| Protein denaturation (2° structure) | 10–100 |
| Short chain alkane liquefaction | |
| Ethane | <0.050 |
| Propane | <0.011 |
| Butane | <0.004 |

[a]Robinson & sligar (1995, Methods Enzym. 259:395–427)
[b]Younglove and Ely (1987, J. Phys. Chem. Ref. Data 16: 577–769)

An important aspect of the present invention is that because the samples of the present method do not contain high salt and water content of typical biological samples, they can be used in NMR probes having a cooled or cryogenic probe head (U.S. Pat. No. 5,889,456). Such probes have the advantage of low noise and high sensitivity. While the analysis of proteins, prepared by conventional methods, that contain high salt and water (commonly termed as "lossy") at low temperatures is problematic, the present invention provides protein samples that are amenable to low temperature analysis.

Various other objects, features, and advantages of the present invention will become apparent from the following detailed description, taken in conjunction with the accompanying drawings.

EXAMPLE 1

This embodiment illustrates the preparation of protein-reverse micelle samples. Preparation of reverse micelles are known to those skilled in the art. Lyophilized protein is dissolved in an appropriate volume of aqueous buffer to achieve the desired water loading, $w_o$ (mole ratio $H_2O$/surfactant), for the concentration of surfactant used. The water loading parameter, $w_o$, represents a compromise between minimizing the average protein/micelle radius in pentane solution and having enough water (buffer) to solubilize the protein. Too much water in the micelle, i.e. typically, a $w_o$ of greater than 30 will lead to a visible precipitate, while too little water i.e., typically a $w_o$ of less than about 5, will lead to insufficient hydration and protein denaturation. As is known to those skilled in the art, optical water loading can be determined empirically.

The solubilization of proteins in reverse micelles dissolved in alkanes is dependent upon ionic strength, pH, and AOT concentration. For example, ethane, propane and butane are known to those skilled in the art to support formation of homogeneous and stable solutions of high concentrations of AOT reverse micelles. Solvent density appears to be a key factor in the capacity of a given alkane to support high concentrations of reverse micelles. A rough estimate of the behavior of the reverse micelle system for each alkane with each protein can be determined by surveying their behavior in the classical AOT-isooctane system using UV/V absorption and fluorescence spectroscopy.

Figure 2:
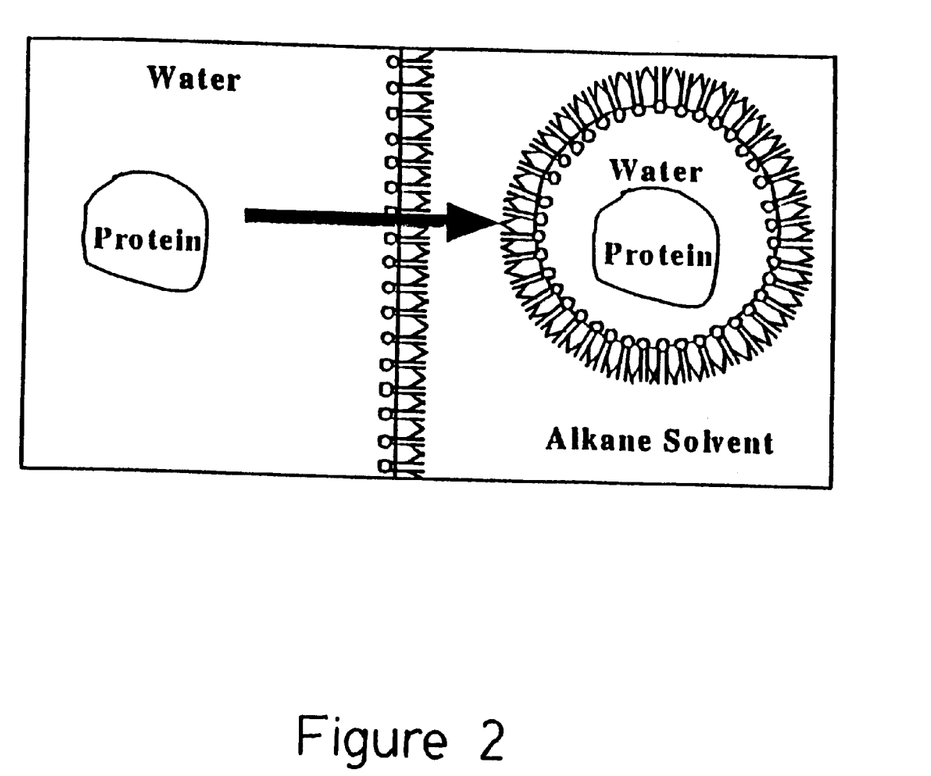
FIG. 2 is an illustration of the phase transfer method for solubilization of water core of reverse micelles formed in organic solvent.

One method of solubilization of water-soluble proteins in the water core of reverse micelles formed in organic solvent is the phase transfer method and is illustrated in FIG. 2. The simple phase transfer method works well with isooctane where the protein is transferred from an aqueous layer to the organic layer. This method can be used for butane where only very modest pressures are required to maintain a liquid state. Propane and ethane can be liquefied over a known amount of water, protein and surfactant. This allows for precise control of the water content. Solubilization of these three alkanes can be carried out by methods known to those skilled in the art. For example, solubilization can be achieved by employing a so-called supercritical fluid (SCF) pump (Kloehn) to liquefy and transfer. A three window optical cell capable of both absorption and fluorescence spectroscopy at pressures up to approximately 50 bar can be used.

In one illustration of this embodiment, ubiquitin reverse micelles were prepared in AOT as the surfactant and pentane as the solvent. A sample prepared with 2.0 ml of 75 mM AOT in pentane required 26.4 uL of aqueous buffer to place $w_o$ at 10. To prepare a reverse micellar solution of ubiquitin, a 50 mM sodium acetate buffer at pH=4.5 containing 250 mM sodium chloride was used. The pH is chosen such that a net positive charge is kept on the protein (pI~7) which facilitates transfer of the hydrated protein into the AOT reversed micelles which have negatively charged head groups on their interior. Sodium chloride is added to minimize strong interactions between ubiquitin and the head groups. The solubilized/wetted protein is transferred to a screw top NMR tube with a teflon septum, and premixed pentane-AOT solution is added to it with a few gentle shakes. A cloudy solution results which clears within 30 minutes. A lock solvent such as benzene-d6 is added (generally 7–10% of the total volume). Alternatively, a coaxial capillary containing D2O as a lock solvent can also be used. Finally, a vortex plug is placed at the air/solvent interface and the tube is properly sealed.

Figure 3:
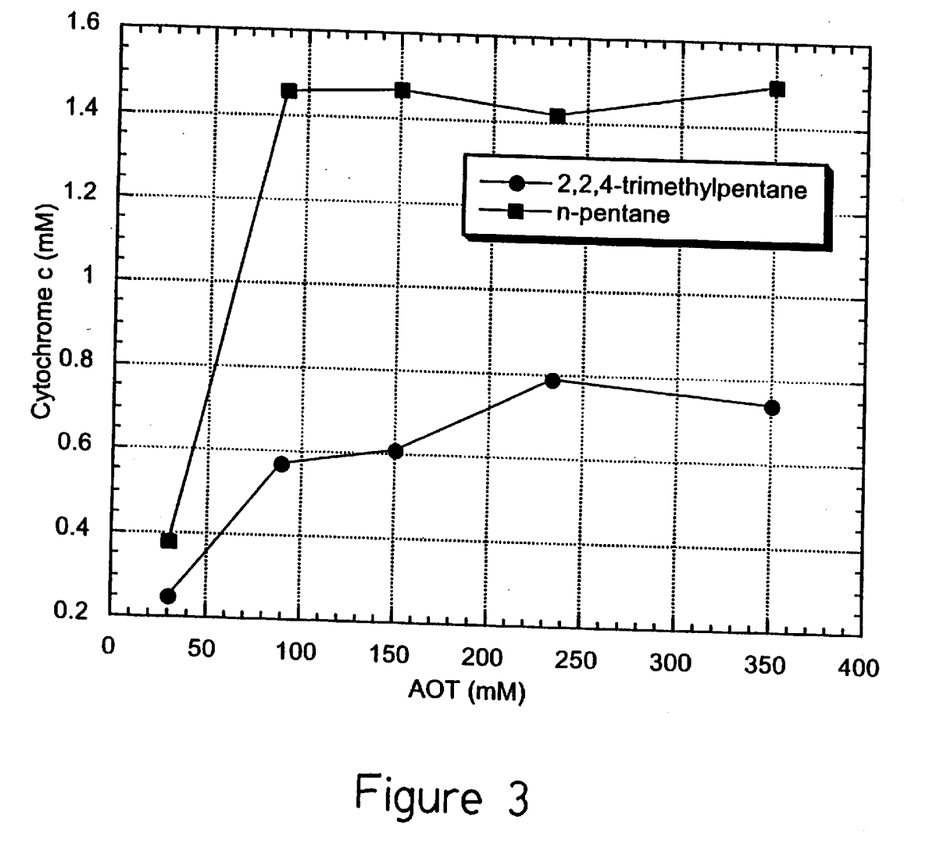
FIG. 3 is a plot illustrating the maximum solubility of reduced cytochrome c in AOT reverse micelles in isooctane (2,2,4,-trimethylpentane) or n-pentane.

In another illustration of this embodiment, by using the method of solubilization disclosed herein, cytochrome c was solubilized in AOT reverse micelles in isooctane or pentane. The maximum solubility of reduced cytochrome c in AOT reverse micelles in isooctane (2,2,4-trimethylpentane) or n-pentane is shown in FIG. 3. Samples were prepared at room temperature by phase transfer from 0.1 M KCl, 50 mM potassium phosphate solutions of cytochrome c into the indicated AOT solution and assayed optically.

Solubilization of other proteins in reverse micelles can be carried out similarly. Preferably, there should be one protein molecule in a reverse micelle. However, the ability to control the number of protein molecules that are encapsulated per reverse micelle allows the use of the method of the present invention to analyze protein aggregates such as prion proteins or amyloid proteins.

EXAMPLE 2

Figure 4:
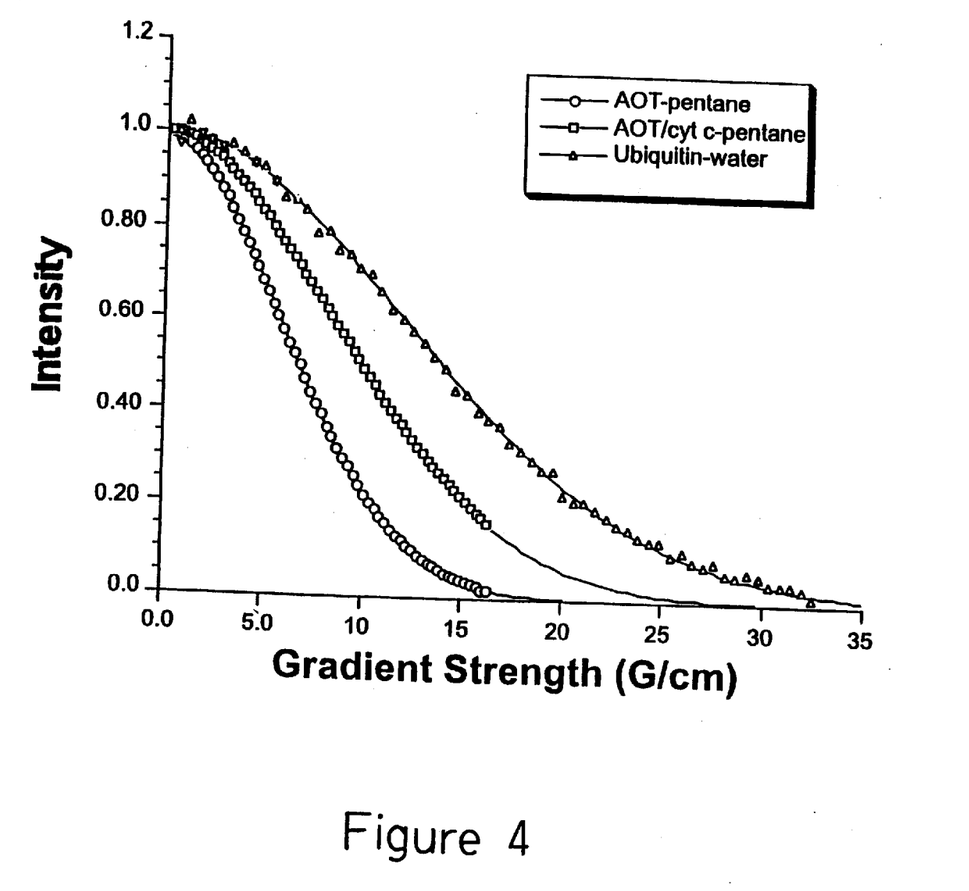
FIG. 4 is a plot of comparison of diffusion rates of ubiquitin and lysozyme in water to the diffusion rates of "empty" AOT micelles in pentane and cytochrome c loaded micelles in pentane.

The hydrodynamic performance of the reverse micelle system was confirmed using gradient diffusion methods of Altieri et al., 1995 (*J. Am. Chem. Soc.* 117:7566–7567), which method is hereby incorporated by reference. The apparent diffusion rates of ubiquitin in water (Mr 8.5 kDa) was compared to the diffusion rates of "empty" AOT micelles in pentane and cytochrome c loaded AOT micelles in pentane. FIG. 4 shows the pulsed field gradient NMR self-diffusion measurements of the translational diffusion of ubiquitin in water, lysozyme in water, AOT reverse micelles in pentane, and cytochrome C-AOT reverse micelles in pentane at 20 C. Tie fitted translation diffusion constants are $9.6 \times 10^{-6}$, $7.3 \times 10^{-6}$, $4.0 \times 10^{-6}$, and $1.9 \times 10^{-6}$ cm$^2$/sec, respectively.

As seen in FIG. 4, at 20° C., ubiquitin in water and the "empty" AOT reverse micelles in pentane have diffusion rates differing by a factor of about 2. The "empty" AOT reverse micelles and cytochrome c loaded AOT micelles in pentane also differ in diffusion rates about a factor of 2. The translation diffusion (Dtrans) constant for a sphere is given by the Einstein-Sutherland equation as:

$$D_{trans} = kT/f = kT/6\pi\eta r_h$$

At this temperature, water and pentane differ in viscosity by about 4 fold. This suggests that the effective radius of the "empty" AOT micelle in pentane is about 1.6 times that of hydrated ubiquitin. A surprising result is the observation that the "empty" AOT reverse micelle has a diffusion constant approximately twice that of an AOT reverse micelle loaded with cytochrome c which is completely consistent with one cytochrome c molecule per micelle. These data demonstrate the ability of using the method of the present invention to give cytochrome c (in a reverse AOT micelle in pentane) a faster translational (and presumably rotational) diffusion rate than ubiquitin (in water), a smaller protein.

EXAMPLE 3

Figure 5:
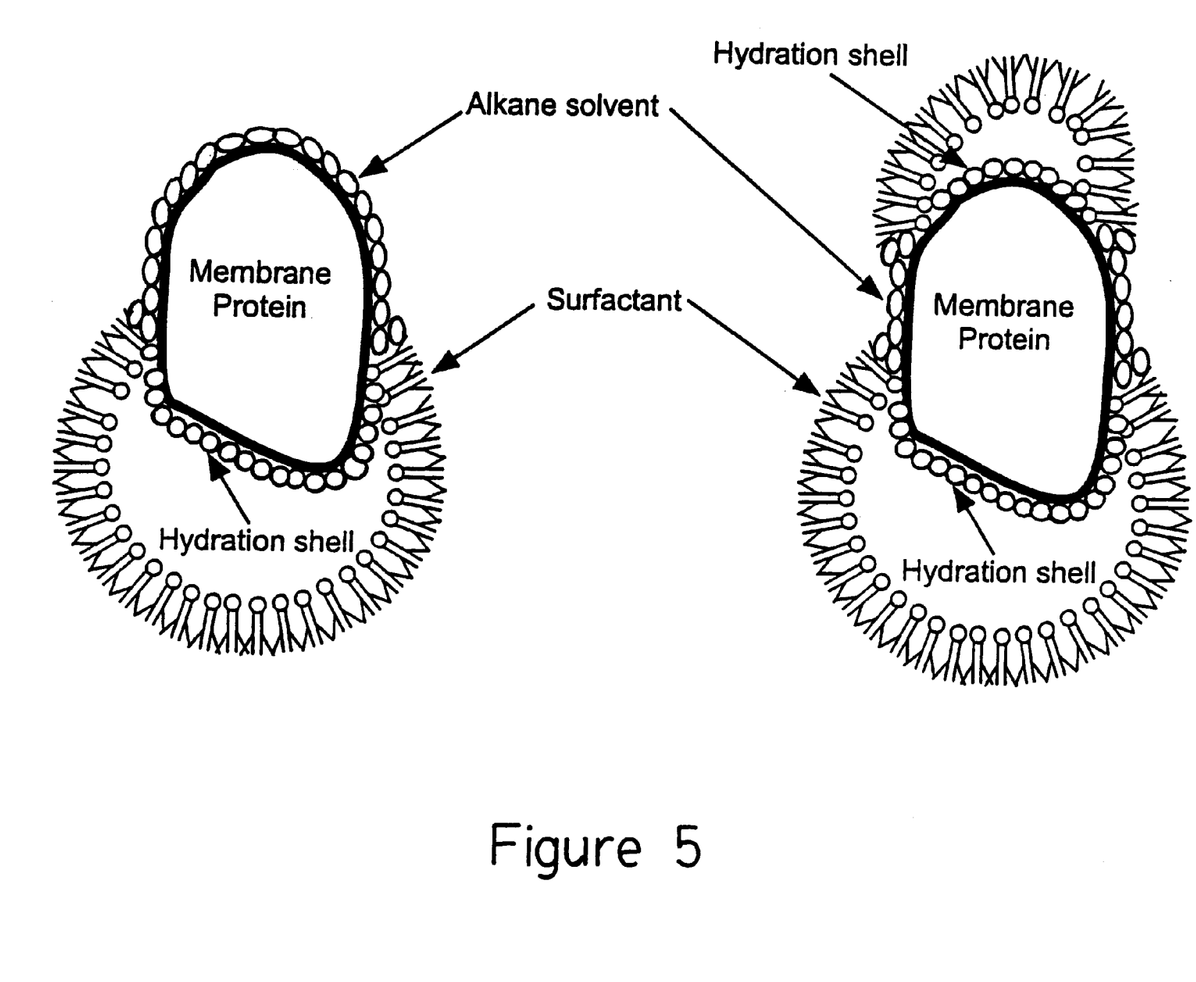
FIG. 5 is a schematic illustration of solubilization of an integral membrane protein.

This embodiment illustrates the use of the method of the present invention for NMR analysis of proteins having exposed hydrophilic and hydrophobic components like integral membrane proteins. The reverse micelle carries with it other important potential applications. In contrast to micelles of surfactants in water, the water containing reverse micelle in an organic solvent can offer two solvents to the solubilized protein. This provides a potential route to the solubilization of integral membrane proteins where the aqueous phase would solubilize the hydrophilic component while the alkane phase to be used here would solubilize the integral membrane component. The surfactant would act as a bridge between the two phases, one organic and one aqueous, bridged by the reverse micelle surfactant to solubilize an integral membrane protein. This is schematically illustrated in FIG. 5. The case on the left corresponds to a protein which has only one hydrophilic face while the case on the right corresponds to a protein which normally completely spans the lipid membrane bilayer.

In addition, the present method can also be used to improve the resolution of proteins less than 25 kDa in size. For example, the significantly decreased linewidths will allow resolution of weak couplings in E. COSY experiments directed at quantification of torsion angles. Similarly, lengthened $T_2$ times will allow more comprehensive long range correlation analysis.

EXAMPLE 4

This embodiment illustrates the construction of a high pressure cell for use with the method of the present invention. The pressure cell for the invention should meet several criteria. First, as only sub-mM concentrations of protein and other macromolecules are likely to be routinely solubilized by solutions of reverse micelles, it is preferable to use the larger active volume of an 8 mm triple resonance probe to compensate. Second, the NMR cell must be RF transparent, of NMR quality (good lineshape), and reliable at pressures of 50–100 bar. Third, the NMR cell must be accommodated by a standard triple resonance NMR probe and have the capability of "tuning" the pressure of the sample, i.e., be continuously variable.

The relatively low pressures required for the application described here opens up the number of materials that could be used. For high pressure NMR cells which must perform at pressures above 1.2 kbar, single crystal sapphire tubes need to be used. However, consideration of the geometry of the 8 mm tube makes use of single crystal sapphire problematic. There are several materials which have equivalent or superior tensile strengths that can be precisely machined to such a geometry. Zirconium oxide (i.e., hot isostatically pressed Zirconia) and silicon nitride are two examples. In a preferred embodiment, zirconium oxide is used. An 8 mm o.d./6 mm i.d. tube would have a burst pressure well above 300 bar and an active volume ~50% over that of a conventional 5 mm tube. The tube is sealed to the housing by the self-sealing action of an embedded o-ring and a washer. Similarly, the cover is sealed to the housing by the self-sealing action of an o-ring. Thus, the use of glue or other adhesives is avoided.

Figure 6:
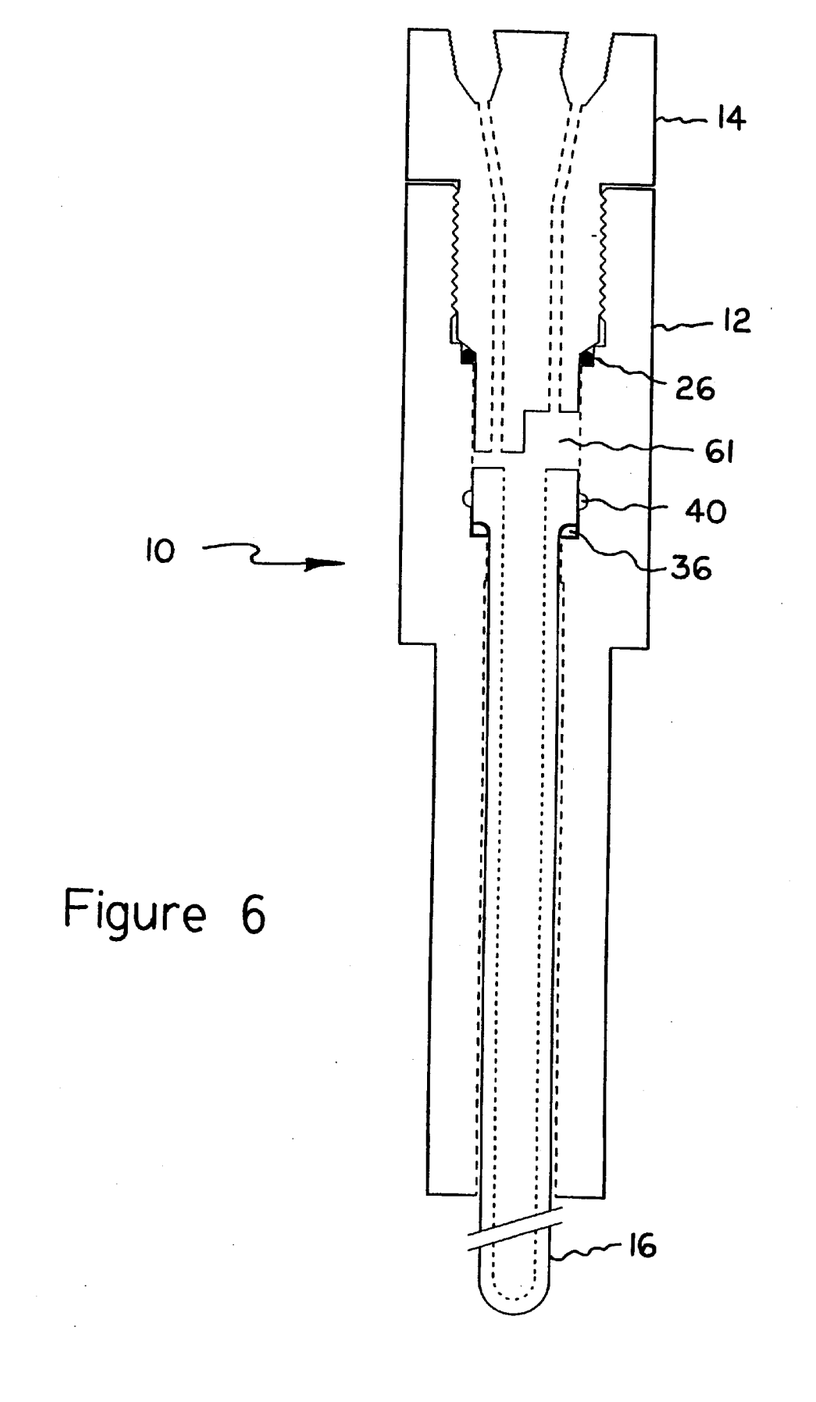
FIG. 6 is a schematic illustration of a cross section of the pressure cell used in the method of the present invention.

A schematic illustration of one design of the "high" pressure NMR cell 10 for an 8 mm triple resonance probe is shown in FIG. 6. The BeCu housing 12 is mated with a threaded top 14. The top has two ports suitable for high pressure fittings. The top port acts as an inlet for liquid alkane and the bottom port acts as an inlet for sample or as an outlet for discharging gas while filling with liquid. The tube 16 is self-seals under pressure against the collar of the housing by a boron nitride washer 36 and an embedded o-ring 40. The housing self-seals under pressure against the threaded top by an o-ring 26 placed in a collar between the housing and the threaded top. The tube dimensions should be such that the tube will fit into the particular probe selected.

Figure 7:
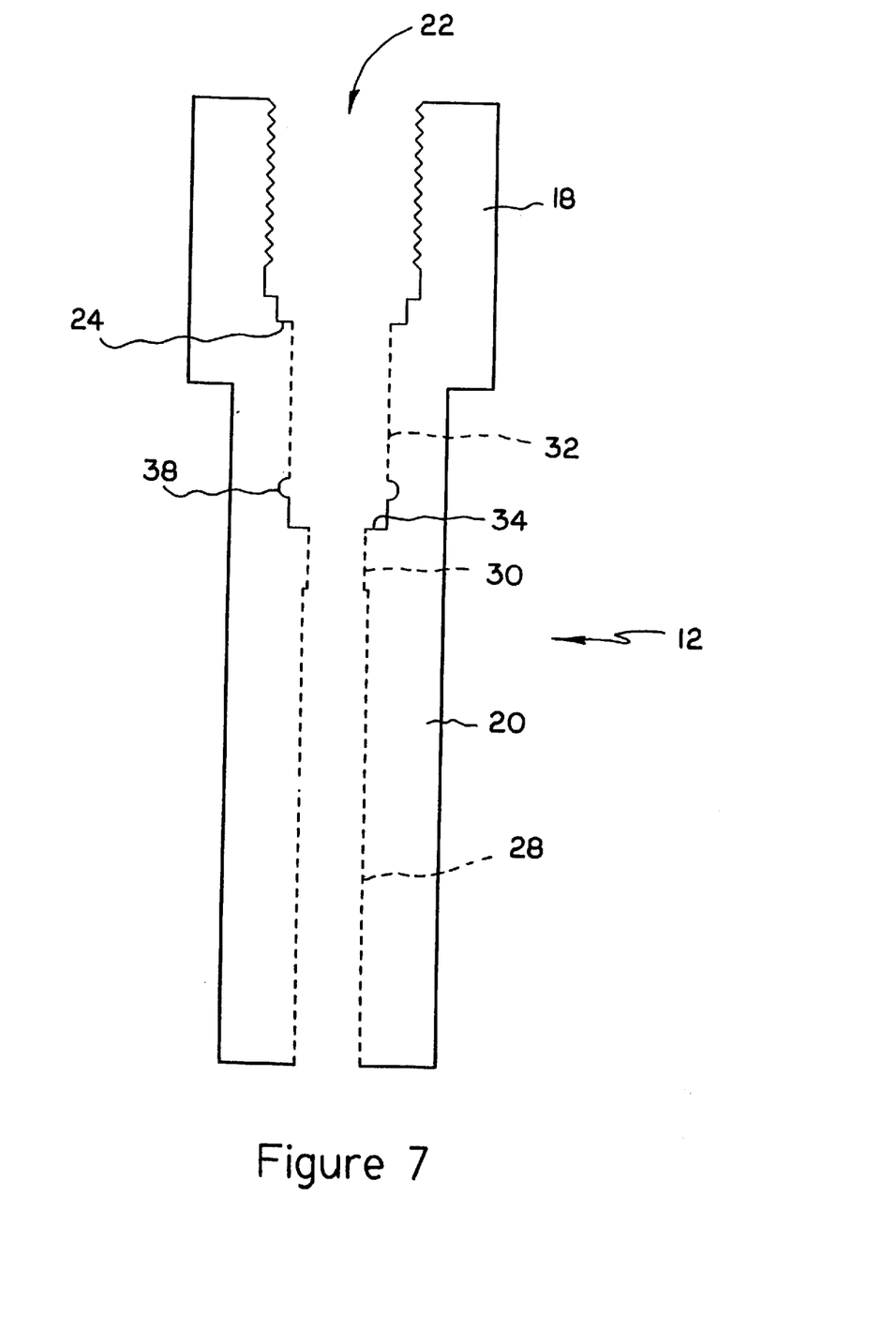
FIG. 7 is a schematic illustration of a cross section of the housing of the pressure cell.

As shown in FIG. 7, housing 12 is a stepped cylindrical tube. It is made of a non-magnetic metal with a high tensile strength. Suitable materials for the housing include, but are not limited to, stainless steel, titanium alloys, and beryllium copper alloys. In a preferred embodiment, the housing is made of Be—Cu alloy. Housing 12 has a wide upper section 18 and a narrow lower section 20. Upper section 18 has an internally tapped well 22 to receive cover 14. The bottom corners of the well have a two-step edge. On the lower step 24 is housed O-ring 26 which provides a tight self-seal between cover 14 and upper section 18. Housing 12 has three bore sections, first bore section 28, second bore section 30, and third bore section 32. Second bore section 30 is narrower than first bore section 28. Third bore section 32 is wider than either first bore section 28 or second bore section 30. The sudden transition from second bore section 30 to third bore section 32 provides a flat surface or collar 34 which forms a sealing surface for sample tube 16. Washer 36 is placed on collar 34 to provide a pressure seal between housing 12 and sample tube 16 on the load bearing side. In a preferred embodiment, the washer is made of boron nitride. This washer also provides a cushion to allow for minor imperfections in the material of the sample tube or the Be—Cu collar 34. The diameter of third bore 32 is such that sample tube 16 fits snugly in it. Lower section 20 also has groove 38 to capture O-ring 40 which forms a pressure seal with sample tube 16.

Figure 8:
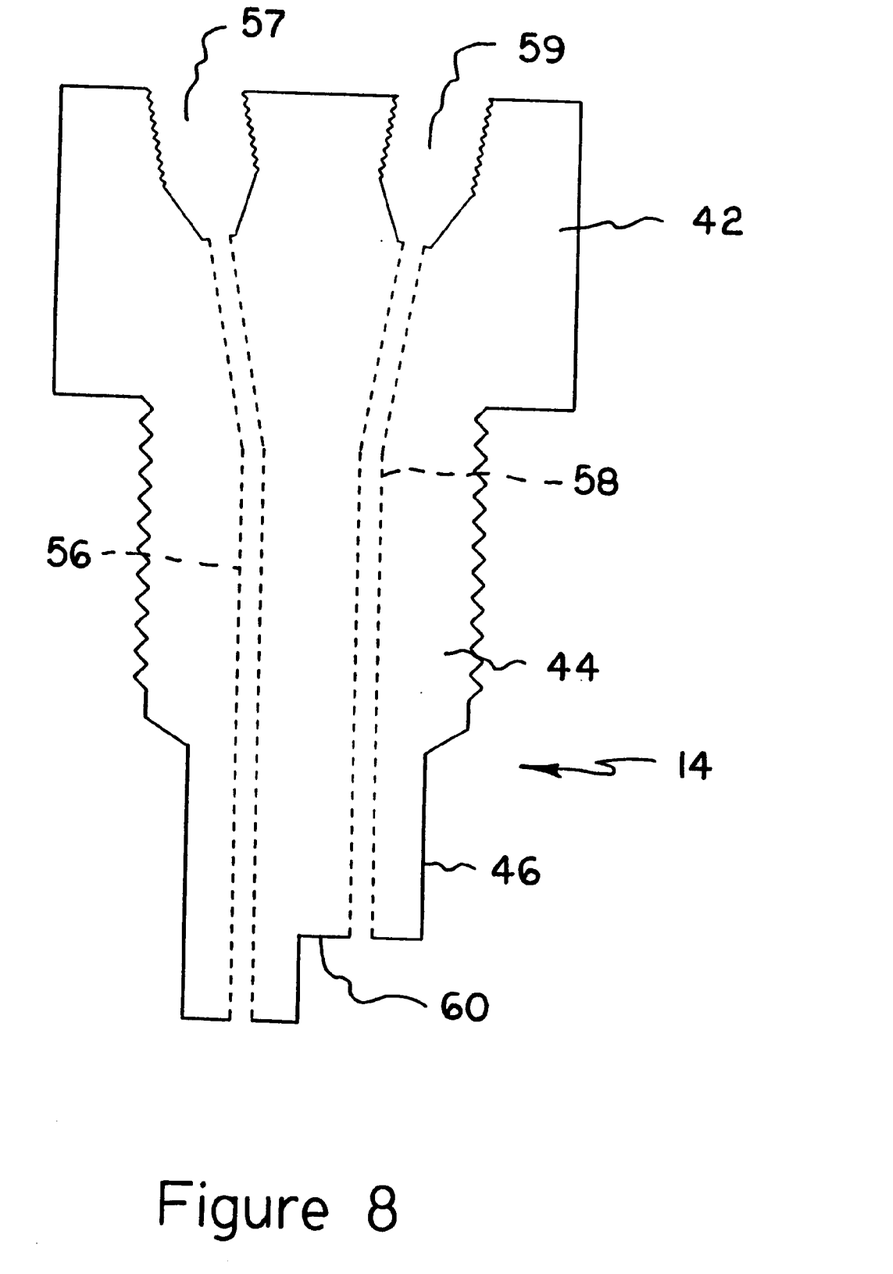
FIG. 8 is a schematic illustration of a cross section of the cover of the pressure cell.

Cover 14 is made of the same material as the housing and has two internal bores 56 and 58 (FIG. 8). When screwed into housing 12, cover 14 fits into internally-tapped well 22. Cover 14 has top section 42, middle section 44, and lower section 46. The outer surface of middle section 44 is threaded so as to be screwed into internally-tapped well 22 of housing 12. The transition of the outer surface of middle section 44 to lower section 46 is angled so as to capture O-ring 40 against the corner of lower step 24 when cover 14 is screwed into housing 12. Any angle such that the O-ring is not pinched or cut when installing the cover 14 into housing 12 can be utilized to house the O-ring against the wall of lower step 24. In a preferred embodiment, this angle is between about 10° to about 70°. At the top of cover 14 the bores 56 and 58 have threaded openings 57 and 59, respectively configured to receive standard fittings. Cover 14 also has a step at the end of bore 58. This step creates an opening 61 between the top of tube 16 and the step 60 when installed. This opening acts as a collector for gas that separates from the liquid phase.

Figure 9:
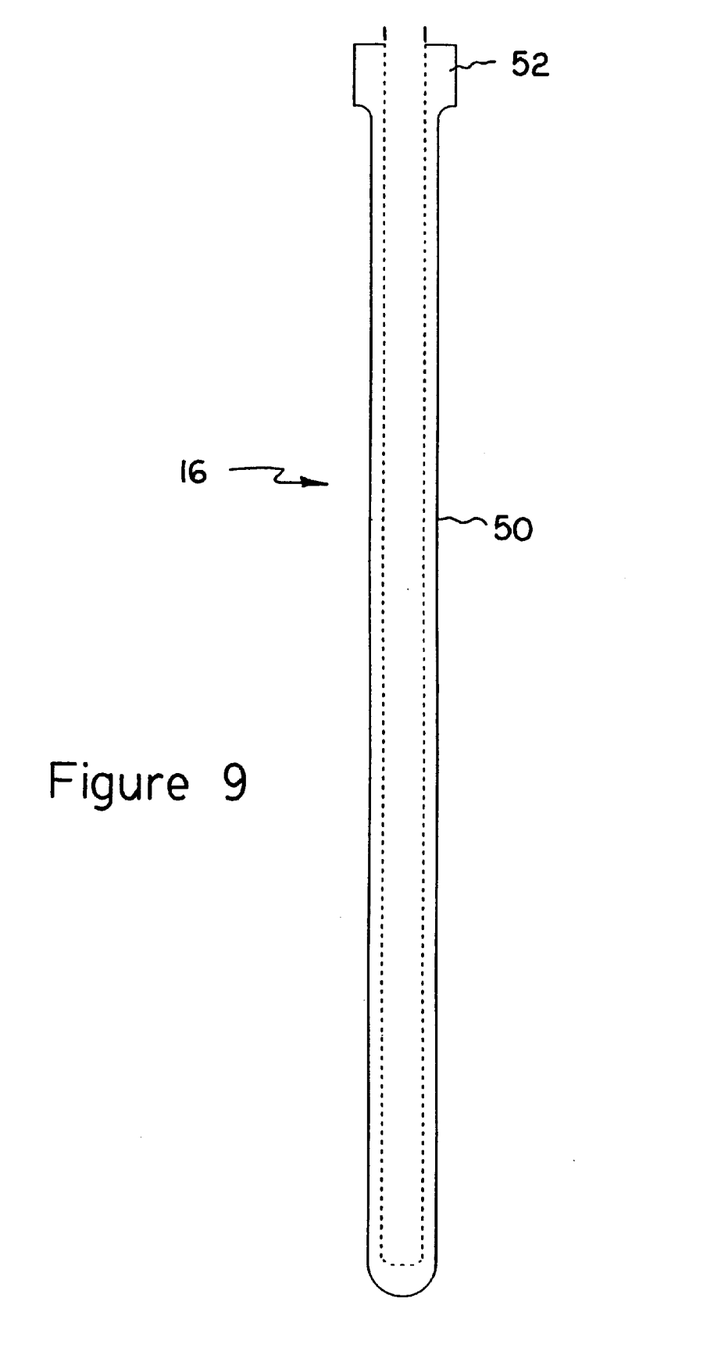
FIG. 9 is a schematic illustration of a cross section of the sample tune of the pressure cell.

The internal bore of tube 16 is of the same diameter as the internal bore of cover 14. Sample tube 16 is closed at one end, has main section 50, and flange 52 at the open end. The outer diameter of main section 50 is such that it will fit snugly in second bore section 30. When the sample tube is placed in the housing, flange 52 rests on collar 34.

In one embodiment, a pressure cell was constructed based on the interior dimensions of a standard Nalorac or Varian 8 mm probe and a standard Oxford high resolution shim stack assembly. Averting to FIGS. 6–9, the housing has a first bore section 28 of 0.355" diameter which transitions into a 0.325" second bore section 30 and then into a 0.503" third bore section 32. The transition from the 0.325" bore to the 0.503" section provides a flat surface or collar 34 on which a boron nitride washer is placed to provide a pressure-seal between the housing and the NMR tube 16 on the load-bearing side. The NMR tube 16 is 6.150" long and has a diameter of 0.315" with a flanged end. Flange 52 is 0.300" high with a diameter of 0.500" which allows for a nominal clearance of 0.0015" between the flange and the housing when the NMR tube is placed inside the housing. The surface of the flange is ground to <0.001" to provide a uniform surface to seal against. Main section 50 of the NMR tube of diameter 0.315" provides a nominal clearance of 0.0015" with the second bore section 30. Groove 38 has an O-ring installed in it to form a seal between the NMR tube flange 52 and the Be—Cu housing 12. This O-ring seal is critical and must fill the groove to approximately 95% when assembled. Moreover, preferably, there should be no more than 0.001" of space between third bore section 32 and flange 52 to avoid extrusion of the O-ring. The height of the step 60 at the end of cover 14 is nominally 0.200". These dimensions are provided for illustrative purposes only and variations will be apparent to those skilled in the art.

The tube is of the same general design as a high pressure sapphire tube disclosed in patent application Ser. No. 08/967,996, which disclosure is herein incorporated by reference, with a duplicate seal system involving o-rings embedded in a custom machined BeCu collar and a boron nitride washer (see FIG. 6). This seal system self-seals under pressure. The NMR cell assembly is pressurized via a small diameter stainless steel tube leading from the bore of the magnet to the pressure generator, which in this case will be a supercritical fluid pump. This arrangement is very easy to manipulate and control. It should be mentioned that although the pressurization is effectively "gaseous", in contrast to the liquid pressurization of our high pressure cell (Urbauer et al., 1996), it is not as explosive as might be first be imagined. First, the volumes and pressures are small. Second, the liquid alkanes will lose considerable energy upon vaporization resulting from a sudden pressure drop (Joule-Thompson effect). The combustion risk is also very low as VT control is done with nitrogen gas, not dry air, so there will be negligible oxygen available in the bore of magnet.

EXAMPLE 5

This embodiment illustrates the use of NMR technology to the reverse micelles of proteins prepared as in Example 1 and also demonstrates that encapsulation of proteins in reverse micelles does not significantly alter their native structure. A high resolution NMR cell capable of safe operation at pressures up to 150 bar in an 8 mm triple resonance probe was used. This assembly can be used to characterize the NMR properties of the various proteins under a range of conditions and thereby demonstrate the method of the present invention.

Figure 10:
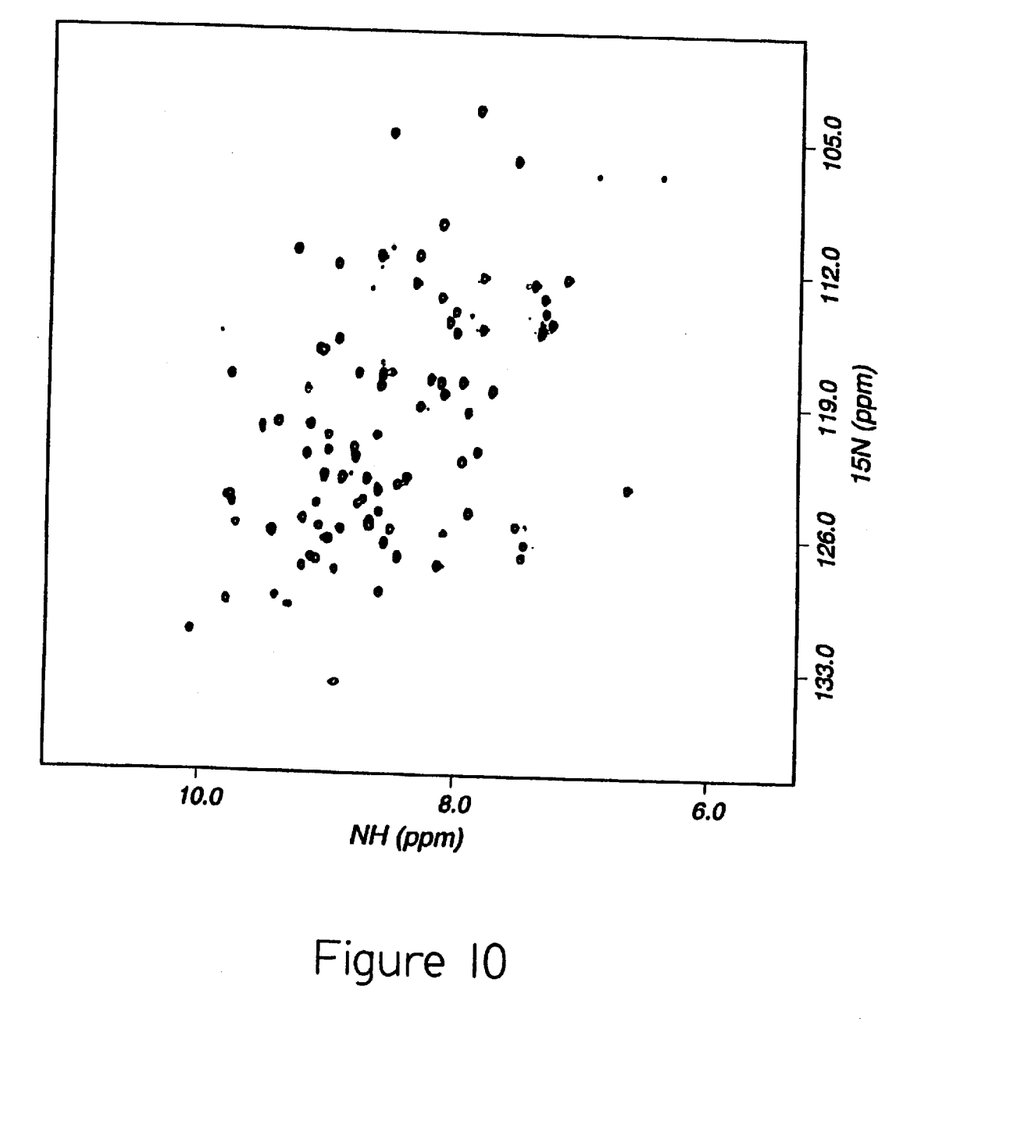
FIG. 10 is a $^{15}$N-HSQC spectrum of recombinant human ubiquitin in AOT/water/pentane reverse micelles in an 8 mm probe in a standard tube.
Figure 11A:
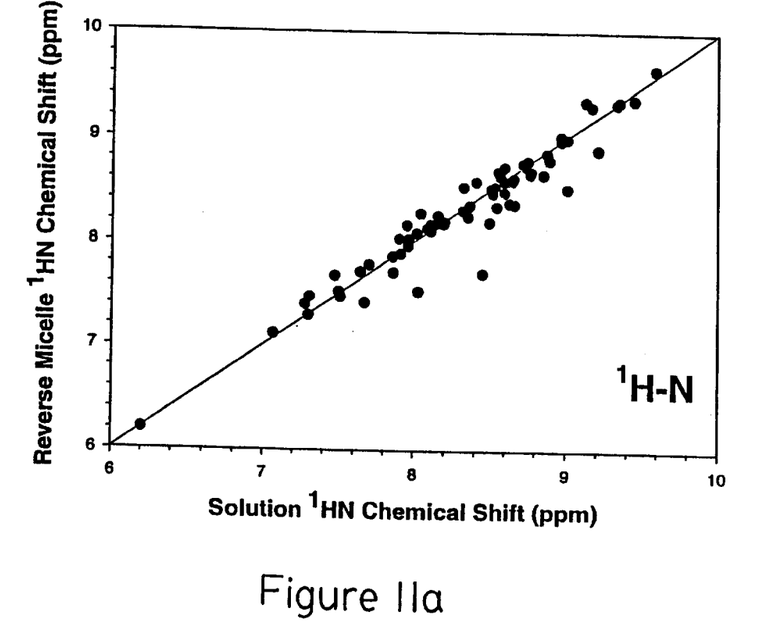
FIG. 11a and 11b is a representation of the correlation of amide $^1$H (FIG. 11a) and $^{15}$N (FIG. 11b) chemical shifts of recombinant human ubiquitin in aqueous buffer with those of the protein encapsulated in a reverse micelle dissolved in pentane.
Figure 11B:
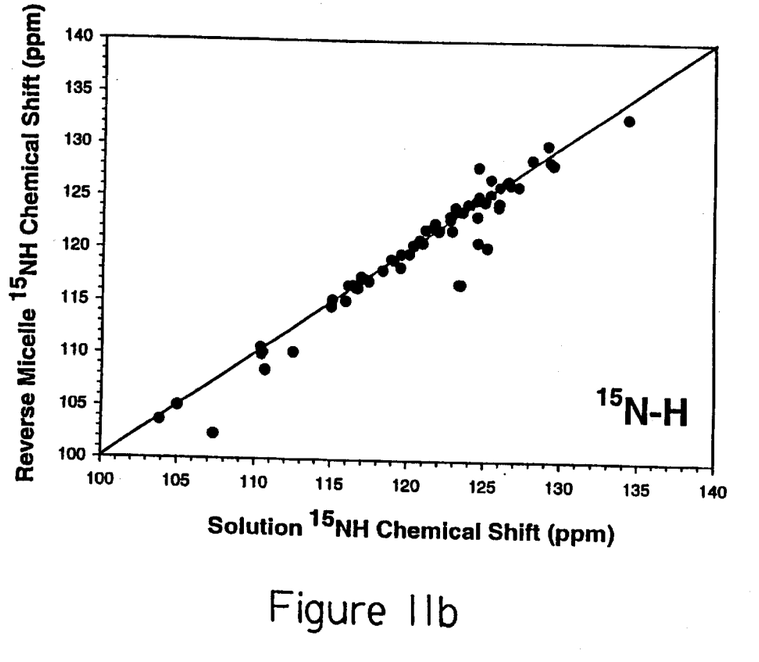

In one illustration of this embodiment, $^{15}$N-HSQC spectra was obtained in an 8 mm probe in a standard tube at 750 MHz for ubiquitin that was recombinantly enriched with 13C according to the method of Wand et al., (1996, Biochemistry, 35:6116–6125), which method is herein incorporated by reference. introduced into reverse micelles of AOT in pentane. The spectrum was processed to 1024× 1024. The concentration of ubiquitin was 0.25 mM. Hydrodynamic diffusion studies confirmed that there was a single protein molecule per reverse micelle. As shown in FIG. 10, detailed inspection of the spectrum reveals numerous small chemical shift changes relative to the equivalent spectrum obtained from an aqueous sample. While not intending to be bound by any particular theory, it is believed that these chemical shift changes are not due to structural differences but represent chemical shift changes brought about by the large electric fields known to exist at the interface of such reverse micelles. Comparison of the chemical shifts of amide $^1$H and $^{15}$N in the AOT reverse micelle and those in water reveals minimal differences (FIG. 11a and 11b). Including all data, the standard deviations between amide $^1$H and $^{15}$N chemical shifts of ubiquitin in the two states are 0.17 and 1.6 ppm respectively. Two localized regions display perturbations. These include the C-terminal residues R72 and R74 and residues 45 to 48 that form a tight turn. The $^{15}$N-resolved NOE spectrum of ubiquitin in AOT/pentane displays the same pattern of nuclear Overhauser effects among main chain hydrogens as observed when the protein is dissolved directly in water (DiStefano et al., 1987, Biochemistry, 31:3645–3652.). These data demonstrates that the method of encapsulation of proteins as disclosed in the present invention does not introduce any significant distortion of their native structure.

It should be understood that the examples disclosed herein are for illustrative purposes only and other modifications of the embodiments of the present invention that are obvious to those skilled in the art are intended to be within the scope of the present invention.

We claim:

1. A method for NMR spectroscopy of molecules comprising the steps of
   (a) preparing reverse micelles containing the molecule, wherein the reverse micelle comprises a surfactant;

(b) solvating the reverse micelles from (a) in a low viscosity solvent; and (c) subjecting the solvated reverse micelles from (b) to NMR spectroscopy.

2. The method of claim 1, wherein the molecule is a protein molecule.

3. The method of claim 1, wherein the surfactant is selected from the group consisting of dioleylphosphoric acid and sodium bis(2-ethylhexyl)sulfosuccinate.

4. The method of claim 1, wherein the surfactant is dioleylphosphoric acid.

5. The method of claim 1, wherein the surfactant is sodium bis(2-ethylhexyl)sulfosuccinate.

6. The method of claim 1, wherein the low viscosity solvent is selected from the group consisting of a short chain alkane, a halocarbon and carbon dioxide.

7. The method of claim 6, wherein the low viscosity solvent is a short chain alkane.

8. The method of claim 7, wherein the short chain alkane is selected from the group consisting of ethane, propane, butane, pentane and isooctane.

9. The method of claim 6, wherein the low viscosity solvent is a halocarbon.

10. The method of claim 6, wherein the low viscosity solvent is carbon dioxide.

11. The method of claim 1, wherein the molecule is a protein aggregate.

12. A method for NMR spectroscopy of molecules comprising the steps of (a) preparing reverse micelles containing the molecule, wherein the reverse micelle comprises a surfactant;

(b) solvating the reverse micelles from (a) in a low viscosity solvent; and (c) subjecting the solvated reverse micelles from (b) to NMR spectroscopy wherein the NMR spectroscopy is performed in cryogenic probes.

* * * * *

UNITED STATES PATENT AND TRADEMARK OFFICE
CERTIFICATE OF CORRECTION

PATENT NO.    : 6,198,281 B1
DATED         : March 6, 2001
INVENTOR(S)   : Wand et al.

It is certified that error appears in the above-identified patent and that said Letters Patent is hereby corrected as shown below:

Title page, item (54)
Delete "NMR SPECTROSCOPY OF LARGE PROTEINS", and insert
-- HIGH-RESOLUTION NMR SPECTROSCOPY OF MOLECULES ENCAPSULATED IN LOW VISCOSITY FLUIDS --.

Signed and Sealed this

Twenty-fifth Day of September, 2001

Attest:

NICHOLAS P. GODICI
Attesting Officer     Acting Director of the United States Patent and Trademark Office